US007961128B2

United States Patent
Kim et al.

(10) Patent No.: US 7,961,128 B2
(45) Date of Patent: Jun. 14, 2011

(54) PULSE GENERATOR AND CONTINUOUS-TIME SIGMA-DELTA MODULATOR

(75) Inventors: Yi Gyeong Kim, Daejeon (KR); Min Hyung Cho, Daejeon (KR); Jong Kee Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 13 days.

(21) Appl. No.: 12/509,152

(22) Filed: Jul. 24, 2009

(65) Prior Publication Data

US 2010/0156686 A1  Jun. 24, 2010

(30) Foreign Application Priority Data

Dec. 22, 2008  (KR) .................. 10-2008-0131642

(51) Int. Cl.
*H03M 3/00* (2006.01)
(52) U.S. Cl. ...................... 341/143; 341/152
(58) Field of Classification Search ............ 341/143
See application file for complete search history.

(56) References Cited

U.S. PATENT DOCUMENTS

| | | | | |
|---|---|---|---|---|
| 7,262,723 B2 * | 8/2007 | Straussnig et al. | ............ | 341/120 |
| 7,315,269 B2 * | 1/2008 | Schreier et al. | ............... | 341/143 |
| 7,379,005 B2 * | 5/2008 | Wiesbauer et al. | ........... | 341/144 |
| 7,397,291 B1 | 7/2008 | Parkes, Jr. et al. | | |
| 2007/0164884 A1 | 7/2007 | Ihs | | |

FOREIGN PATENT DOCUMENTS

| | | |
|---|---|---|
| EP | 1538752 A1 | 6/2005 |
| KR | 1020080064378 A | 7/2008 |
| WO | WO 98/54840 | 12/1998 |

OTHER PUBLICATIONS

Khiem Nguyen et al., "A 106-dB SNR Hybrid Oversampling Analog-to-Digital Converter for Digital Audio," IEEE Journal of Solid-State Circuits, Dec. 2005, pp. 2408-2415, vol. 40, No. 12.

* cited by examiner

Primary Examiner — Khai M Nguyen

(57) ABSTRACT

Provided is a clock generator employed in a continuous-time sigma-delta modulator. The clock generator includes an oscillator configured to generate pulses in response to an enable signal, a counter configured to count the number of pulses generated by the oscillator and output the total pulse count, and an output circuit configured to output an inactivated output signal if the pulse count of the counter is equal to a pulse-width control bit. The oscillator includes an astable multi-vibrator. Since the astable multi-vibrator capable of generating a low-jitter pulse from a jittered clock is used as the oscillator, a signal-to-noise ratio is improved. A simple configuration using only digital circuits makes it easier to design a circuit and adjust pulse width. Moreover, according to the structure of the astable multi-vibrator, it is possible to design a circuit to optimally modulate pulse width in connection with process variations of resistors and capacitors used in the continuous-time sigma-delta modulator.

12 Claims, 4 Drawing Sheets

* RZ: Return to Zero

PULSE GENERATOR AND CONTINUOUS-TIME SIGMA-DELTA MODULATOR

CROSS-REFERENCE TO RELATED APPLICATION

This application claims priority to and the benefit of Korean Patent Application No. 10-2008-0131642, filed Dec. 22, 2008, the disclosure of which is incorporated herein by reference in its entirety.

BACKGROUND

1. Field of the Invention

The present invention relates to a continuous-time sigma-delta modulator, and more particularly, to a sigma-delta modulator using low-jitter pulses.

2. Discussion of Related Art

A sigma-delta modulator may be composed of a discrete-time system or a continuous-time system.

The discrete-time system uses switched capacitor techniques by which signals are stored and transferred through capacitors. For example, an integrator and a digital-to-analog converter (DAC) are configured such that an input signal and a fed-back DAC signal are stored as charge in a capacitor in a sampling phase of a clock, and the sampled charge is transferred to an integrating capacitor in an integration phase.

The continuous-time system operates without an input signal sampling process. In the continuous-time system, a DAC transfers an analog current signal to an integrator in response to a clock signal.

Due to fewer requirements for design of an amplifier of the integrator than in the discrete-time system, a continuous-time system enables a sigma-delta modulator to operate at high speed under low power. Also, since the integrator does not perform sampling, the sigma-delta modulator basically has an anti-aliasing filtering function. Further, since an input terminal is coupled to a resistive element or a gate of a transistor, it is easy to design a preceding circuit block of the sigma-delta modulator when forming a system with the sigma-delta modulator.

However, the continuous-time sigma-delta modulator has a weak signal-to-noise ratio (SNR) that is highly dependent on jitter in a clock signal applied to its internal DAC.

If a pulse width of a clock signal applied to the DAC is irregular due to jitter, it has the same effect as adding noise to the DAC signal. That is, noise is further generated as shown by the dotted line from the frequency response of the sigma-delta modulator. Accordingly, signal-to-noise ratio (SNR) performance of the sigma-delta modulator is deteriorated.

SUMMARY OF THE INVENTION

The present invention is directed to preventing SNR degradation due to jitter in an external clock in a continuous-time sigma-delta modulator, and providing a sigma-delta modulator with a clock generator capable of generating a low-jitter clock signal from a high-jitter clock signal.

One aspect of the present invention provides a pulse generator including: an oscillator configured to generate pulses in response to an enable signal; a counter configured to count the number of pulses generated by the oscillator and output the total pulse count; and an output circuit configured to output an inactivated output signal if the pulse count of the counter is equal to a pulse-width control bit. The oscillator includes an astable multi-vibrator.

The output circuit may include: a comparator configured to compare the pulse count of the counter with the pulse-width control bit, and output an activated comparison signal as if the pulse count is equal to the pulse-width control bit; and a latch configured to receive the comparison signal and generate the inactivated output signal when the comparison signal is active.

The latch may receive an external clock and generate the activated output signal when the external clock is active.

The oscillator may receive the output signal as the enable signal.

The astable multi-vibrator may include a Schmitt trigger circuit.

The astable multi-vibrator may include: the Schmitt trigger circuit configured to receive the enable signal; a resistor connected between input and output terminals of the Schmitt trigger circuit; and a capacitor connected between the input terminal and ground.

The astable multi-vibrator may adjust device values of the resistor and the capacitor and set a pulse frequency.

Another aspect of the present invention provides a continuous-time sigma-delta modulator including: a subtractor configured to subtract an input signal and an output of a digital-to-analog converter; an integrator configured to integrate an output of the subtractor and quantize noise of the input signal; a quantizer configured to compare an output of the integrator with a reference voltage and output a comparison signal; the digital-to-analog converter configured to transform the comparison signal of the quantizer into an analog signal in response to a clock signal and output the analog signal to the subtractor; and a clock generator configured to generate the clock signal of a predetermined pulse width without jitter using an astable multi-vibrator, and output the clock signal to the digital-to-analog converter.

The clock generator may receive an external clock and a pulse-width control bit, and generate the clock signal, which is active for the duration of the pulse width, which is equal to the pulse-width control bit, starting from activation of the external clock, through the astable multi-vibrator.

The astable multi-vibrator may include a Schmitt trigger circuit.

The clock generator may include: the astable multi-vibrator configured to receive the clock signal as an enable signal, and oscillate and generate pulses when the enable signal is active; a counter configured to count the number of pulses generated by the astable multi-vibrator and output the total pulse count; and an output circuit configured to output the inactivated clock signal if the pulse count of the counter is equal to the pulse-width control bit.

The output circuit may include a comparator configured to compare the pulse count of the counter with the pulse-width control bit and output an activated comparison signal if the pulse count is equal to the pulse-width control bit; and a latch configured to receive the comparison signal and generate the inactivated output signal when the comparison signal is active.

The latch may receive an external clock and generate the activated clock signal when the external clock is active.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which.

DETAILED DESCRIPTION OF EXEMPLARY EMBODIMENTS

Hereinafter, exemplary embodiments of the present invention will be described in detail. However, the present invention is not limited to the exemplary embodiments disclosed below but can be implemented in various forms. The following exemplary embodiments are described in order to enable those of ordinary skill in the art to embody and practice the present invention.

Hereinafter, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments only and is not intended to be limiting of example exemplary embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

It should be further understood that the term "circuit", "-or/er", or "module" means a unit for processing at least one function or operation, which may be implemented in hardware or software structure, or a combination of software and hardware configurations.

In order to more specifically describe example exemplary embodiments, various aspects will be described in detail with reference to the attached drawings. However, the present invention is not limited to example exemplary embodiments described.

Figure 1:
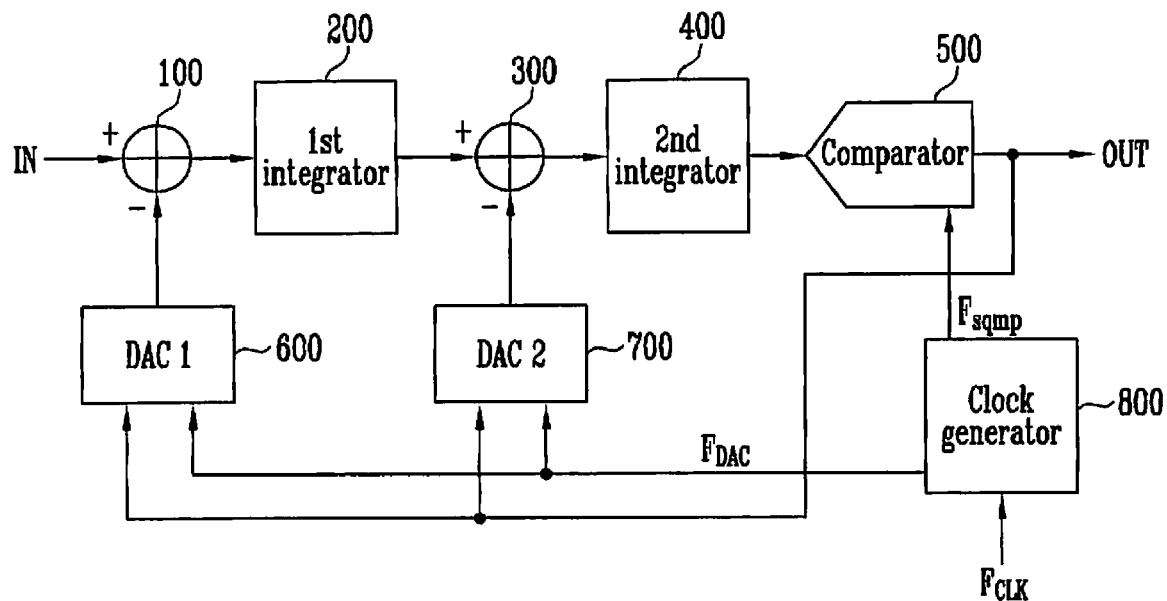
FIG. 1 illustrates a configuration of a sigma-delta modulator according to the present invention.

FIG. 1 illustrates a configuration of a secondary 1-bit sigma-delta modulator according to the present invention.

Figure 2:
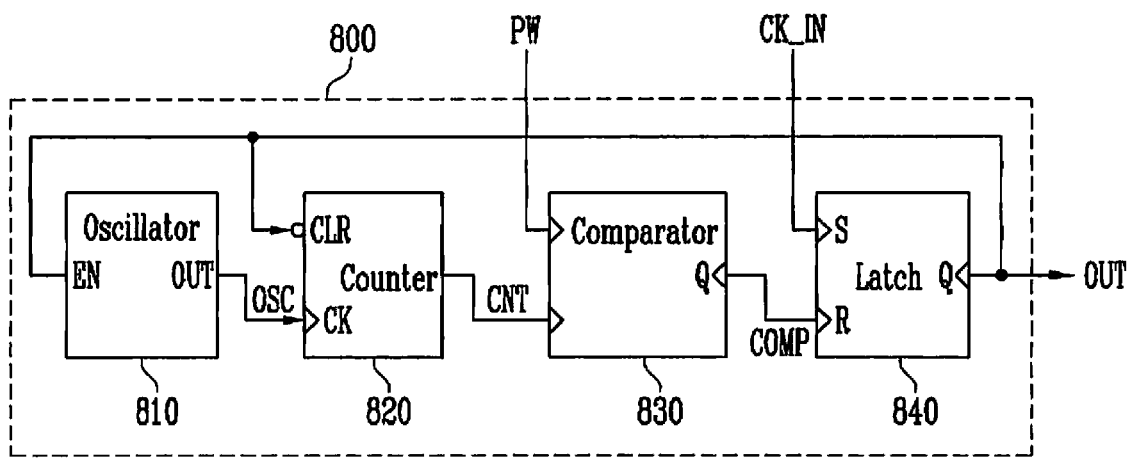
FIG. 2 illustrates a configuration of a clock generator according to the present invention.

Referring to FIG. 2, the sigma-delta modulator according to the present invention features a noise transformation process in which an over-sampling operation is conducted to reduce power of quantized noise, and the quantized noise changes to become smaller within a predetermined bandwidth and larger outside of the predetermined bandwidth.

The sigma-delta modulator includes subtractors 100 and 300, integrators 200 and 400, digital-to-analog converters (DAC1 and DAC2) 600 and 700, and a comparator 500, and has a negative feedback structure where an output of the comparator 500 is fed to the subtractors 100 and 300.

In detail, the comparator 500 compares an applied signal with a common mode voltage and outputs a 1-bit digital signal OUT. The 1-bit digital signal OUT output from the comparator 500 is transformed into analog signals through the DACs 600 and 700. The analog signals from the DACs are subtracted from an input signal IN and an output signal of the integrator 200, respectively, to perform a negative feedback operation.

The sigma-delta modulator according to this exemplary embodiment of the present invention, as illustrated in FIG. 1, includes two integrators 200 and 400, two subtractors 100 and 300, and two DACs 600 and 700. These two DACs 600 and 700 operate in synchronization with a clock signal $F_{DAC}$ and convert a signal of the comparator 500 into an analog signal.

The two DACs 600 and 700 transfer current signals to the integrators 200 and 400 in response to each bit of the clock signal $F_{DAC}$ provided from a clock generator 800. These DACs 600 and 700 may be implemented by switches connecting voltage sources with resistors in response to the clock signal $F_{DAC}$, or by current sources.

The clock generator 800 outputs a sampling clock signal $F_{samp}$ to the comparator 500 using a reference clock $F_{CLK}$, and outputs the clock signal $F_{DAC}$ to these two DACs 600 and 700.

Operation of the generator 800 to provide the clock signal $F_{DAC}$ without jitter to the DACs 600 and 700 even if there is jitter in the reference clock $F_{CLK}$ will be described below.

Figure 3:
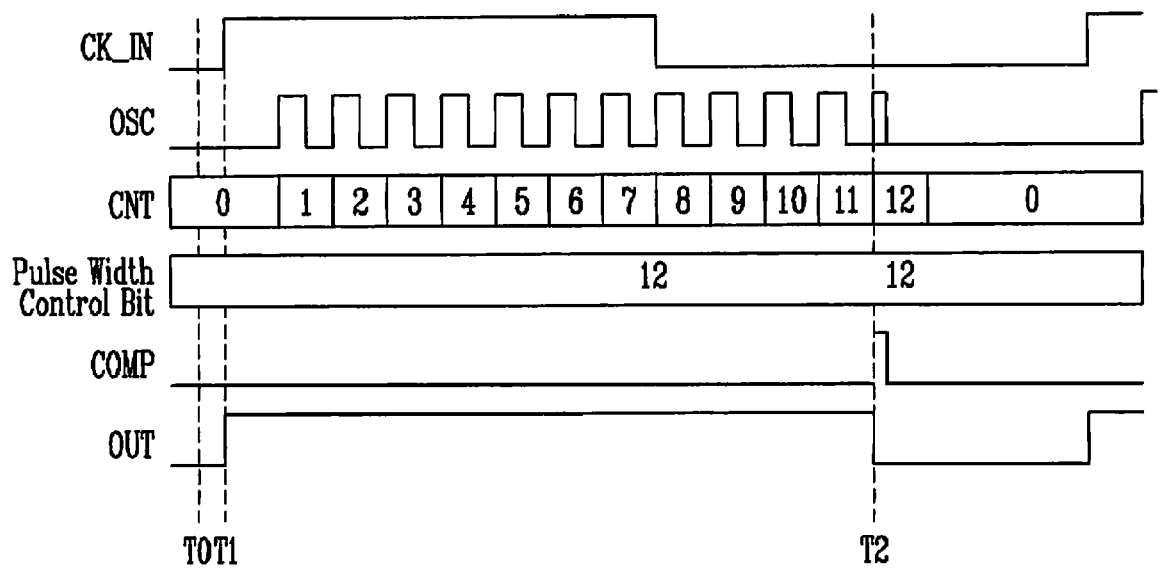
FIG. 3 is a timing diagram illustrating operation of the clock generator shown in FIG. 2.

FIG. 2 illustrates a configuration of the clock generator 800 according to the present invention, and FIG. 3 is a timing diagram illustrating operation of the clock generator 800 shown in FIG. 2.

Referring to FIG. 2, the clock generator 800 includes an oscillator 810 responding to an enable signal EN, a counter 820, a comparator 830, and a latch 840.

The oscillator 810 is a kind of astable multi-vibrator which generates pulses by oscillation when the enable signal EN goes to a high level, i.e., when the enable signal EN is active, and resets its output OSC to low when the enable signal EN goes to a low level, i.e., when the enable signal EN is inactivated.

The counter 820 receives the output OSC from the oscillator 820, counts the number of outputs (i.e., output count) CNT, and outputs the total output count CNT.

The comparator 830 is a kind of digital comparator which receives a pulse-width control bit PW and the output count CNT of the counter 820, and compares whether the output count CNT is equal to the pulse-width control bit PW. If the output count CNT is equal to the pulse-width control bit PW, the comparator 830 generates a comparison signal COMP with a high level. Otherwise, the comparator 830 generates the comparison signal COMP with a low level.

The latch 840 is a kind of S-R latch that receives an external clock CK_IN through its input terminal S and generates the output signal OUT with a high level when the external clock CK_IN goes to a high level. The latch 840 also receives the output COMP from the comparator 830 through its input terminal R and generates the output signal OUT with a low level when the output COMP goes to a high level.

Since the comparator 830 can operate by simply using a specific bit from the output CNT of the counter 820, it is possible to modify the latch 840 by means of another circuit.

Operation of the clock generator 800 of FIG. 2 will now be described with reference to FIG. 3.

First, as the output signal OUT of the clock generator 800 is inactivated at time T0, the oscillator 810 is reset in response to the enable signal EN and the counter 820 is thus cleared.

Next, when the external clock CLK_IN supplied from an external system is inactivated at time T1, the output signal OUT of the latch 840 shown in FIG. 2 goes to a high level. As the output signal OUT of the latch 840 becomes the high level, the oscillator 810 starts oscillating and generates pulses. The pulses generated by the oscillator 810 are input to the counter 820. The counter 820 counts the number of pulses output from the oscillator 810 and provides the output count CNT of the pulses to the comparator 830.

At time T2, if the output pulse count CNT is equal to the pulse-width control bit PW, the comparator 830 outputs the comparison signal COMP of a high level. Thus, if the output of the comparator 830 becomes the high level, the output signal OUT of the latch 840 transitions to a low level and the oscillator 810 and the counter 820 maintain the reset and cleared states until the external clock CK_IN is activated to a high level.

According to this operation, the output signal OUT of the clock generator 800 is generated to have a pulse width as long as the number of pulses provided from the oscillator 810, which is constant if the pulse-width control bit PW is constant.

Therefore, since the output signal OUT of the clock generator 800 depends on jitter characteristics of the oscillator 810, when a low-jitter astable multi-vibrator is used as the oscillator 810, it is possible to meet low-jitter characteristics of the pulses.

By using the output signal OUT for the clock signal $F_{DAC}$ of the DACs of the continuous-time sigma-delta modulator shown in FIG. 1, SNR degradation caused by clock jitter in the continuous-time sigma-delta modulator can be effectively prevented.

Also, by changing the digital pulse-width control bit PW, it is easy to control the pulse width of the output signal OUT of the clock generator 800. Furthermore, since the circuit structure is made up of only digital circuits rather than complicated and sensitive analog circuits, the circuit is easy to design.

Figure 4:
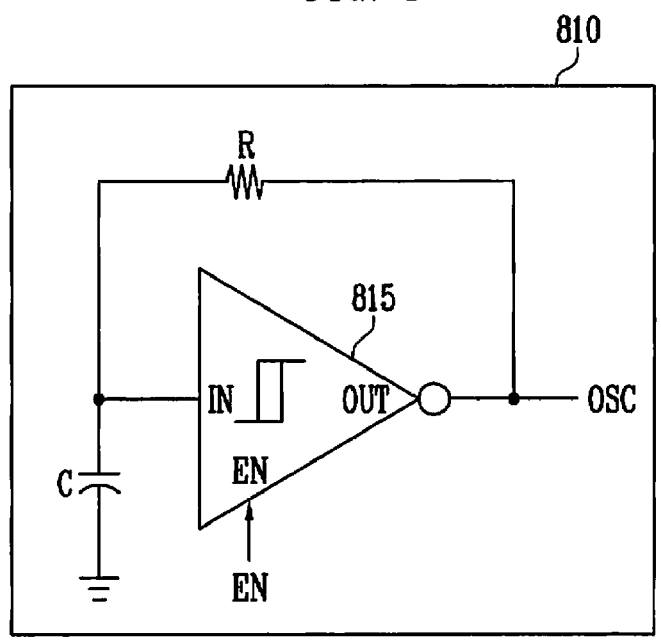
FIG. 4 is a circuit diagram illustrating an example of an astable multi-vibrator that can be used as the oscillator of FIG. 2.

FIG. 4 is a circuit diagram illustrating an example of an astable multi-vibrator that can be used as the oscillator of FIG. 2. The astable multi-vibrator includes a Schmitt trigger circuit.

The oscillator 810 shown in FIG. 4 includes a Schmitt trigger circuit 815 operating in response to the enable signal EN, a resistor R connected between input and output terminals of the Schmitt trigger circuit 815, and a capacitor C connected between the input terminal of the Schmitt trigger circuit 815 and ground.

The oscillator 810 employs the Schmitt trigger circuit 815 therein, capable of establishing an oscillation frequency by adjusting an RC time constant while adjusting values of the resistor R and the capacitor C. In other words, the oscillation frequency depends on the circuit components. For instance, if the RC time constant increases, the oscillation frequency decreases, and if the RC time constant decreases, the oscillation frequency increases. The Schmitt trigger circuit 815 operating with the enable signal EN may be implemented in variety of forms.

Figure 5:
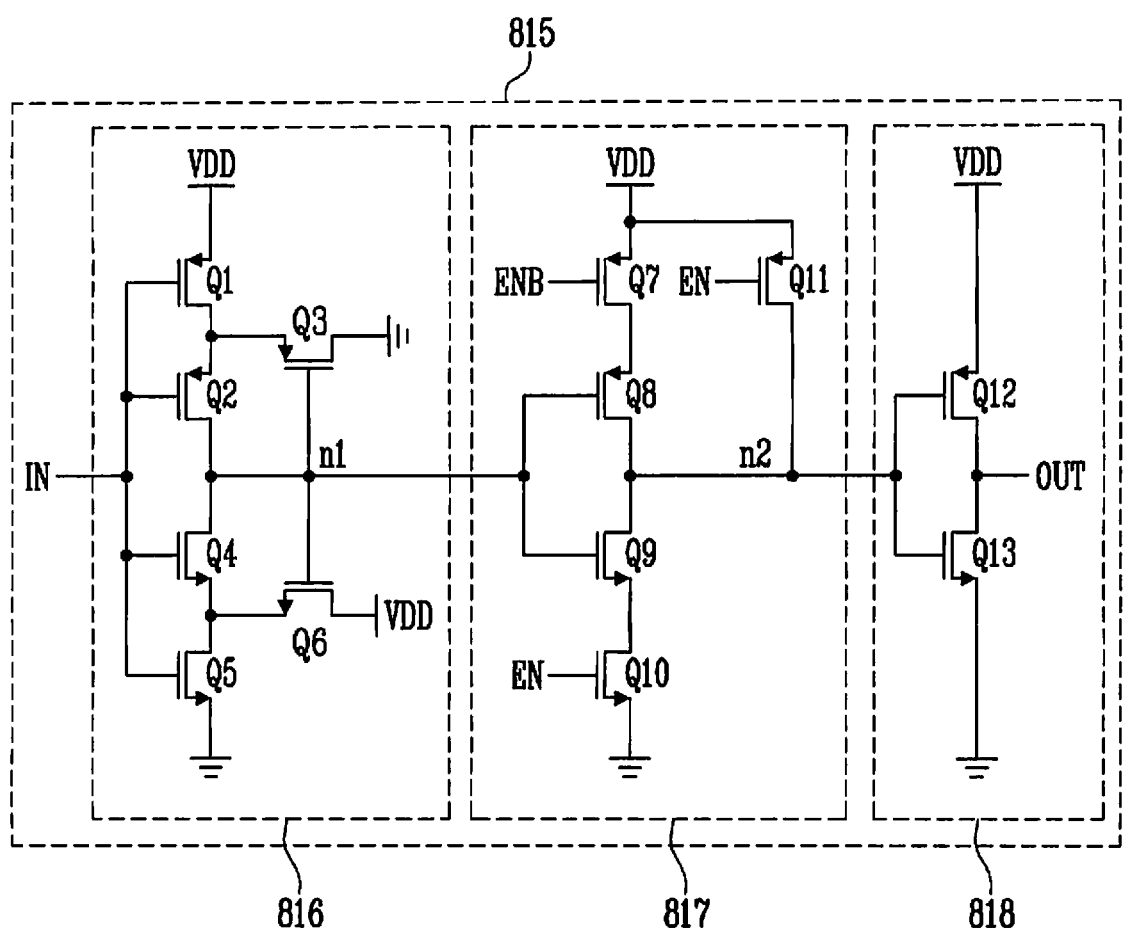
FIG. 5 is a circuit diagram of a Schmitt trigger circuit of FIG. 4.

FIG. 5 is a circuit diagram of the Schmitt trigger circuit 815 of FIG. 4. The Schmitt trigger circuit 815 includes an input Schmitt trigger circuit 816, an enable inverter 817, and an inverter 818. The input Schmitt trigger circuit 816 includes six transistors Q1~Q6 connected between a reference voltage VDD and the ground voltage. The enable inverter circuit 817, which is interposed between a first node n1 connected to the input Schmitt trigger circuit 816 and a second node n2 connected to the inverter 818, includes five transistors Q7~Q11 transferring the reference voltage VDD or the ground voltage. The inverter 818 includes two transistors Q12 and Q13 connected between the reference voltage VDD and the ground voltage.

The Schmitt trigger circuit 816 and the inverter 818 are generally used, and thus will not be described in further detail.

The enable inverter 817 added to the Schmitt trigger circuit 815 to provide an enabling function acts as a general inverter when the enable signal EN has a high level. When the enable signal EN has a low level, an output of the enable inverter 817 is fixed to a high level. As a result, the Schmitt trigger circuit 815 is active when the enable signal EN goes to a high level and inactive when the enable signal EN goes to a low level.

However, the astable multi-vibrator 810 operating with the enable signal EN according to the present invention may be configured by modifying a well-known astable multi-vibrator, by those skilled in the art, using the enabling function.

Effects of the clock generator including a low-jitter oscillator will now be described in conjunction with FIG. 6.

Figure 6:
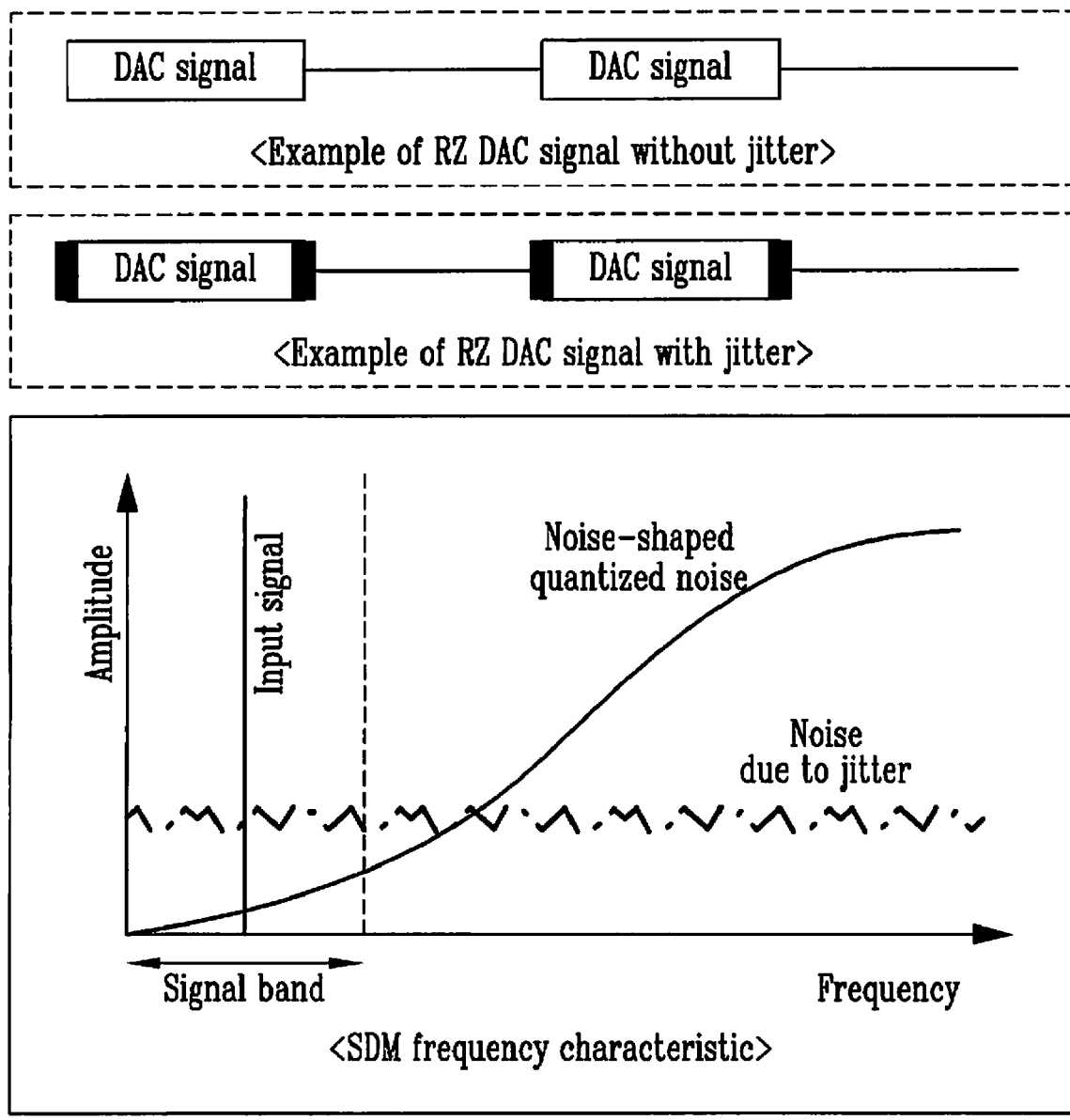
FIG. 6 shows the effect of jitter in a digital-to-analog converter signal on the performance of a sigma-delta modulator.

FIG. 6 shows the effect of jitter in the DACs on performance of the sigma-delta modulator.

In a signal band, quantized noise is lessened through noise shaping characteristics of the sigma-delta modulator to obtain a high SNR.

However, if a pulse width of the clock signal $F_{DAC}$ applied to the DACs 600 and 700 is inconstant due to jitter, it has the same effect as adding noise to the analog signals from the DACs 600 and 700. That is, noise is further generated as shown by the dotted line in the graph of frequency response of the sigma-delta modulator (SDM frequency response). As a result, it degrades the SNR in the signal band of the sigma-delta modulator.

The clock generator 800 according to the present invention helps to maintain a constant pulse width of the clock signal $F_{DAC}$ applied to the DACs 600 and 700, without jitter. The resulting frequency response of the sigma-delta modulator is depicted by the solid curve having a high SNR in the signal band.

As described above, the present invention provides a technical solution to SNR degradation due to jitter in an external clock in a sigma-delta modulator. A pulse generator according to the present invention helps to generate low-jitter pulses from a clock having a lot of jitter. The present invention facilitates circuit design and pulse control because the sigma-delta modulator is composed of digital circuits such as an astable multi-vibrator, a counter, a latch, and so on.

Moreover, according to the structure of the astable multi-vibrator, it is possible to design a circuit to optimally modulate pulse widths in connection with process variations of resistors and capacitors used in a continuous-time sigma-delta modulator.

The present invention may be implemented using computer code that is read by a computer to perform functions such as those described above. Such computer code may be stored on any kind of storage medium that can be read from to carry out the invention. The present invention may be embodied is various other forms by those skilled in the art with reference to the above description.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A pulse generator comprising:
   an oscillator to generate pulses in response to an enable signal;
   a counter to count the number of pulses generated by the oscillator and output the total pulse count; and
   an output circuit to output an inactivated output signal when the total pulse count of the counter is equal to a pulse-width control bit,
   wherein the oscillator comprises an astable multi-vibrator.

2. The pulse generator of claim 1, wherein the output circuit comprises:
   a comparator to compare the total pulse count of the counter with the pulse-width control bit, and output an activated comparison signal when the total pulse count is equal to the pulse-width control bit; and
   a latch to receive the comparison signal and generate the inactivated output signal when the comparison signal is active.

3. The pulse generator of claim 2, wherein the latch receives an external clock and generates the activated output signal when the external clock is active.

4. The pulse generator of claim 2, wherein the oscillator receives the output signals as the enable signal.

5. The pulse generator of claim 4, wherein the astable multi-vibrator comprises a Schmitt trigger circuit.

6. The pulse generator of claim 5, wherein the astable multi-vibrator comprises:
   the Schmitt trigger circuit configured to receive the enable signal;
   a resistor connected between input and output terminals of the Schmitt trigger circuit; and
   a capacitor connected between the input terminal and ground.

7. The pulse generator of claim 6, wherein the astable multi-vibrator adjusts device values of the resistor and the capacitor and sets a pulse frequency.

8. A continuous-time sigma-delta modulator comprising:
   a subtractor configured to subtract an input signal and an output of a digital-toanalog converter;
   an integrator configured to integrate an output of the subtractor and quantize noise of the input signal;
   a quantizer configured to compare an output of the integrator with a reference voltage and output a comparison signal;
   the digital-to-analog converter configured to transform the comparison signal of the quantizer into an analog signal in response to a clock signal and output the analog signal to the subtractor; and
   a clock generator configured to generate the clock signal of a predetermined pulse width without jitter using an astable multi-vibrator, and output the clock signal to the digital-to-analog converter,
   wherein the clock generator receives an external clock and a pulse-width control bit, and generates the clock signal that is active for a duration of the pulse width, which is equal to the pulse-width control bit, starting from activation of the external clock, through the astable multi-vibrator.

9. The continuous-time sigma-delta modulator of claim 8, wherein the astable multi-vibrator comprises a Schmitt trigger circuit.

10. The continuous-time sigma-delta modulator of claim 9, wherein the clock generator comprises:
    the astable multi-vibrator configured to receive the clock signal as an enable signal, and oscillate and generate pulses when the enable signal is active;
    a counter configured to count the number of pulses generated by the astable multi-vibrator and output the total pulse count; and
    an output circuit configured to output the inactivated clock signal when the total pulse count of the counter is equal to the pulse-width control bit.

11. The continuous-time sigma-delta modulator of claim 10, wherein the output circuit comprises:
    a comparator configured to compare the total pulse count of the counter with the pulse-width control bit and output an activated comparison signal when the pulse count is equal to the pulse-width control bit; and
    a latch configured to receive the comparison signal and generate the inactivated output signal when the comparison signal is active.

12. The continuous-time sigma-delta modulator of claim 11, wherein the latch receives an external clock and generates the activated clock signal when the external clock is active.

* * * * *